(12) United States Patent
Chen

(10) Patent No.: US 7,811,933 B2
(45) Date of Patent: Oct. 12, 2010

(54) CMOS-PROCESS-COMPATIBLE PROGRAMMABLE VIA DEVICE

(75) Inventor: Kuan-Neng Chen, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/697,805

(22) Filed: Feb. 1, 2010

(65) Prior Publication Data

US 2010/0127732 A1 May 27, 2010

Related U.S. Application Data

(62) Division of application No. 11/770,455, filed on Jun. 28, 2007, now Pat. No. 7,687,309.

(51) Int. Cl.
*H01L 21/00* (2006.01)
(52) U.S. Cl. .................. 438/667; 438/482; 438/102
(58) Field of Classification Search .............. 438/102, 438/482, 667
See application file for complete search history.

(56) References Cited

U.S. PATENT DOCUMENTS

| | | | |
|---|---|---|---|
| 6,795,338 B2 * | 9/2004 | Parkinson et al. | 365/163 |
| 6,839,263 B2 * | 1/2005 | Fricke et al. | 365/63 |
| 6,967,344 B2 * | 11/2005 | Ovshinsky et al. | 257/2 |
| 7,057,923 B2 * | 6/2006 | Furkay et al. | 365/163 |
| 7,214,957 B2 * | 5/2007 | Ryoo et al. | 257/2 |
| 7,214,958 B2 * | 5/2007 | Happ | 257/4 |
| 7,579,616 B2 * | 8/2009 | Chen et al. | 257/8 |
| 7,608,851 B2 * | 10/2009 | Chen et al. | 257/5 |
| 7,659,534 B2 * | 2/2010 | Chen et al. | 257/3 |
| 7,687,309 B2 * | 3/2010 | Chen | 438/102 |
| 2005/0058187 A1 * | 3/2005 | Groen et al. | 375/219 |
| 2006/0097240 A1 * | 5/2006 | Lowrey et al. | 257/5 |
| 2006/0097343 A1 * | 5/2006 | Parkinson | 257/528 |

(Continued)

OTHER PUBLICATIONS

K.N. Chen et al., Thermal Stress Evaluation of a PCRAM Material Ge2Sb2Te5, 21st IEEE Non-Volatile Semiconductor Memory Workshop, pp. 97-98 (2006).

*Primary Examiner*—Laura M Menz
(74) *Attorney, Agent, or Firm*—Vazken Alexanian; Michael J. Chang, LLC

(57) ABSTRACT

Programmable via devices and methods for the fabrication thereof are provided. In one aspect, a programmable via device is provided comprising a substrate; a dielectric layer on the substrate; a heater on at least a portion of a side of the dielectric layer opposite the substrate; a first oxide layer over the side of the dielectric layer opposite the substrate and surrounding at least a portion of the heater; a first capping layer over a side of the first oxide layer opposite the dielectric layer; at least one programmable via extending through the first capping layer and the first oxide layer and in contact with the heater, the programmable via comprising at least one phase change material; a second capping layer over the programmable via; a second oxide layer over a side of the first capping layer opposite the first oxide layer; a pair of first conductive vias, each extending through the first and second oxide layers and the first capping layer, and in contact with the heater; and a second conductive via, located between the pair of first conductive vias, extending through the second oxide layer and in contact with the second capping layer.

4 Claims, 9 Drawing Sheets

U.S. PATENT DOCUMENTS

| | | | |
|---|---|---|---|
| 2007/0057341 A9* | 3/2007 | Pellizzer | 257/528 |
| 2007/0096071 A1* | 5/2007 | Kordus et al. | 257/2 |
| 2007/0099405 A1* | 5/2007 | Oliva et al. | 438/585 |
| 2008/0142775 A1* | 6/2008 | Chen et al. | 257/4 |
| 2008/0251778 A1* | 10/2008 | Chen et al. | 257/4 |
| 2008/0277644 A1* | 11/2008 | Chen et al. | 257/5 |
| 2009/0003045 A1* | 1/2009 | Chen | 365/163 |
| 2009/0014885 A1* | 1/2009 | Chen et al. | 257/774 |
| 2009/0033358 A1* | 2/2009 | Chen et al. | 326/38 |
| 2009/0033360 A1* | 2/2009 | Chen et al. | 326/41 |
| 2009/0101882 A1* | 4/2009 | Chen et al. | 257/3 |
| 2009/0111263 A1* | 4/2009 | Chen et al. | 438/667 |
| 2009/0291546 A1* | 11/2009 | Chen et al. | 438/482 |
| 2009/0305460 A1* | 12/2009 | Chen et al. | 438/102 |
| 2010/0038621 A1* | 2/2010 | Chen et al. | 257/3 |

* cited by examiner

CMOS-PROCESS-COMPATIBLE PROGRAMMABLE VIA DEVICE

CROSS-REFERENCE TO RELATED APPLICATIONS

This application is a divisional of U.S. application Ser. No. 11/770,455 filed on Jun. 28, 2007, now U.S. Pat. No. 7,687,309, the contents of which are incorporated herein by reference

FIELD OF THE INVENTION

The present invention relates to reconfigurable circuits, and more particularly, to programmable via devices and methods for fabrication thereof.

BACKGROUND OF THE INVENTION

Reconfigurable circuits have been widely used in the semiconductor industry for field programmable gate arrays (FPGAs) and for repair of a defective memory element. The FPGA consists of a set of simple, configurable logic blocks in an array with interspersed switches that can rearrange interconnections between the logic blocks.

Reconfigurable circuits are also expected to play a significant role in three-dimensional integration technology that is being currently developed. Three-dimensional integration fabricates multilayer structures that can form a single chip combination with different functionalities. In these multilayer (and multifunctional) systems, reconfigurable circuit connection is typically needed to provide controllable logic functionality, memory repair, data encryption, as well as other functions.

A programmable via is an enabling technology for high-performance reconfigurable logic applications without the trade offs in low logic gate density and power. Phase change materials are an attractive option for this application, but to date, have drawn the most attention from semiconductor memory developers as a possible replacement to flash memory.

Programmable vias implementing phase change materials have been developed. One notable challenge that exists, however, with regard to the practical implementation of programmable vias in logic devices, is being able to scale the programmable via process technology to integrate with the current technology node. To date, programmable via process technology is not readily scalable.

Therefore, scalable programmable via technology would be desirable.

SUMMARY OF THE INVENTION

The present invention provides programmable via devices and methods for the fabrication thereof. In one aspect of the invention, a programmable via device is provided. The programmable via device comprises a substrate; a dielectric layer on the substrate; a heater on at least a portion of a side of the dielectric layer opposite the substrate; a first oxide layer over the side of the dielectric layer opposite the substrate and surrounding at least a portion of the heater; a first capping layer over a side of the first oxide layer opposite the dielectric layer; at least one programmable via extending through the first capping layer and the first oxide layer and in contact with the heater, the programmable via comprising at least one phase change material; a second capping layer over the programmable via; a second oxide layer over a side of the first capping layer opposite the first oxide layer; a pair of first conductive vias, each extending through the first and second oxide layers and the first capping layer, and in contact with the heater; and a second conductive via, located between the pair of first conductive vias, extending through the second oxide layer and in contact with the second capping layer.

In another aspect of the invention, a method of fabricating a programmable via device is provided. The method comprises the following steps. A substrate is provided. A dielectric layer is formed on the substrate. A heater is formed over at least a portion of a side of the dielectric layer opposite the substrate. A first oxide layer is deposited over the side of the dielectric layer opposite the substrate, so as to surround at least a portion of the heater. A pair of first conductive vias is formed, wherein each of the first conductive vias extends through the first oxide layer and is in contact with the heater. A first capping layer is deposited over a side of the first oxide layer opposite the dielectric layer. At least one programmable via is formed extending through the first capping layer and the first oxide layer, between the pair of first conductive vias, and in contact with the heater, the programmable via comprising at least one phase change material. A second capping layer is formed over the programmable via. A second oxide layer is deposited over a side of the first capping layer opposite the first oxide layer. The pair of first conductive vias is extended through the first capping layer and the second oxide layer. A second conductive via is formed through the second oxide layer and in contact with the second capping layer.

In yet another aspect of the invention, a method of performing a logic function is provided. The method comprises the following steps. A programmable via device is provided. The programmable via device comprises a substrate; a dielectric layer on the substrate; a heater on at least a portion of a side of the dielectric layer opposite the substrate; a first oxide layer over the side of the dielectric layer opposite the substrate and surrounding at least a portion of the heater; a first capping layer over a side of the first oxide layer opposite the dielectric layer; at least one programmable via extending through the first capping layer and the first oxide layer and in contact with the heater, the programmable via comprising at least one phase change material; a second capping layer over the programmable via; a second oxide layer over a side of the first capping layer opposite the first oxide layer; a pair of first conductive vias, each extending through the first and second oxide layers and the first capping layer, and in contact with the heater; and a second conductive via, located between the pair of first conductive vias, extending through the second oxide layer and in contact with the second capping layer. An OFF switching pulse is passed through the heater, when the programmable via is in a conductive state, the OFF switching pulse being configured to amorphize at least a portion of the phase change material in the programmable via to switch the programmable via to a resistive state and/or an ON switching pulse is passed through the heater, when the programmable via is in a resistive state, the ON switching pulse being configured to anneal at least a portion of the phase change material in the programmable via to switch the programmable via to a conductive state.

A more complete understanding of the present invention, as well as further features and advantages of the present

DETAILED DESCRIPTION OF PREFERRED EMBODIMENTS

Figure 1:
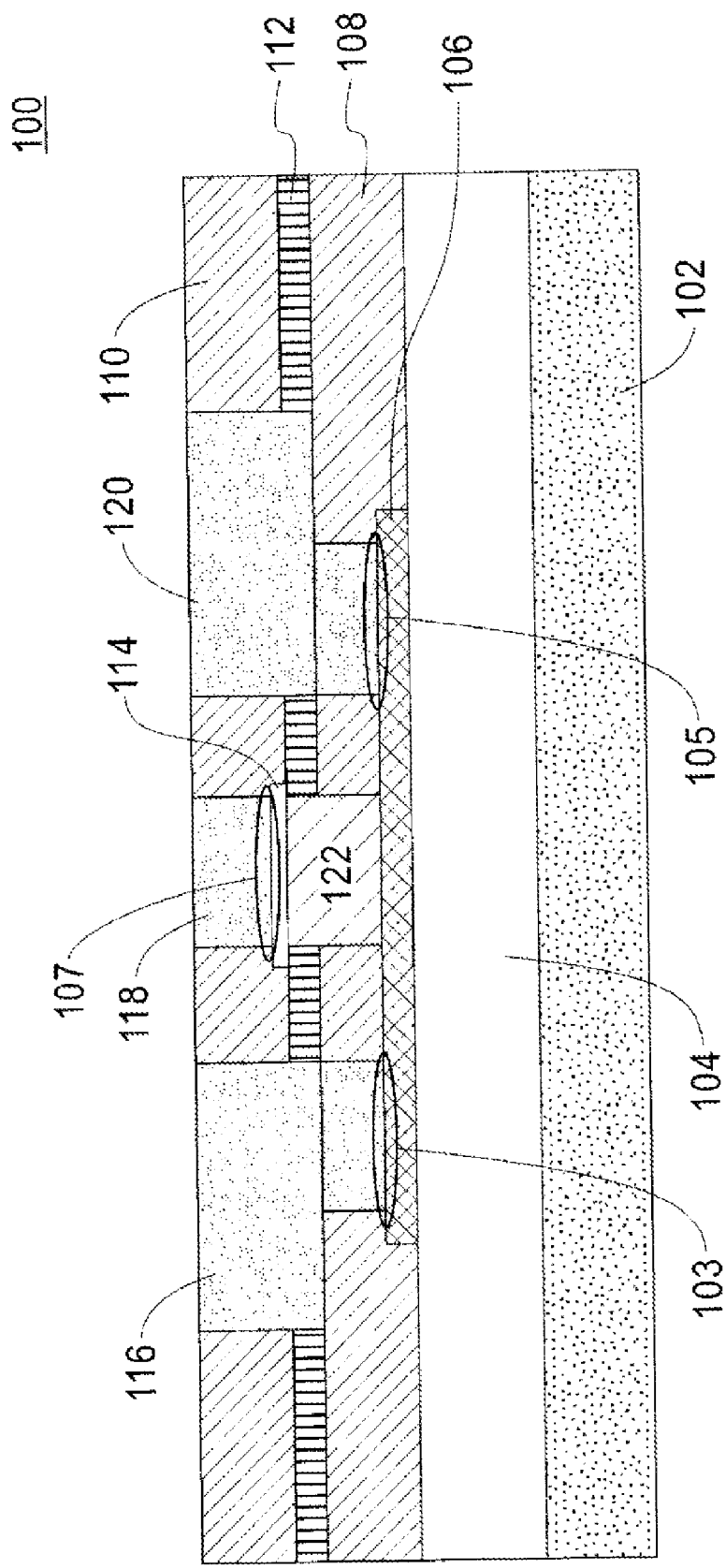
FIG. 1 is a diagram illustrating an exemplary programmable via device according to an embodiment of the present invention.
Figure 2A:
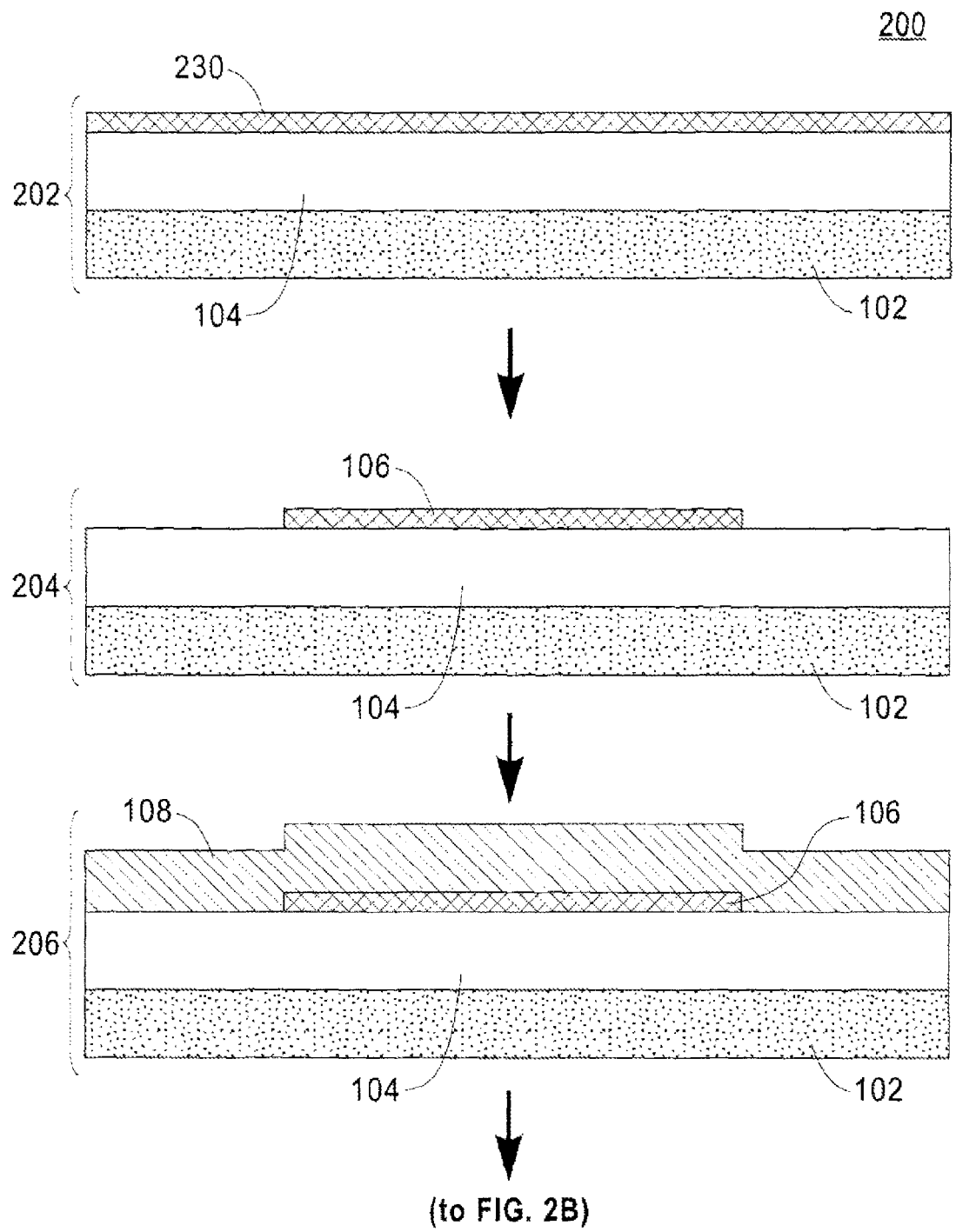
FIGS. 2A-E are diagrams illustrating an exemplary methodology for fabricating a programmable via device according to an embodiment of the present invention.
Figure 2B:
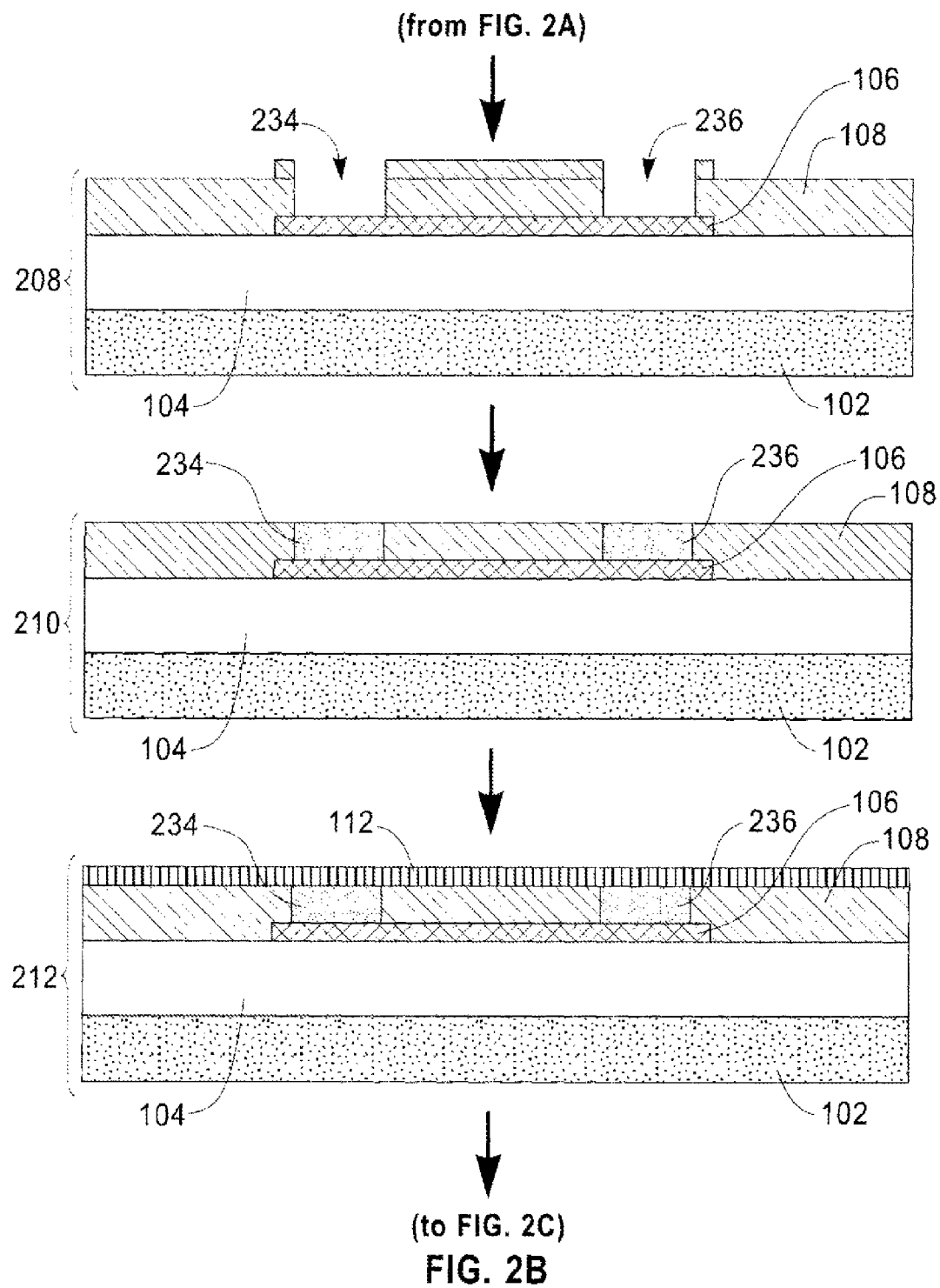
Figure 2C:
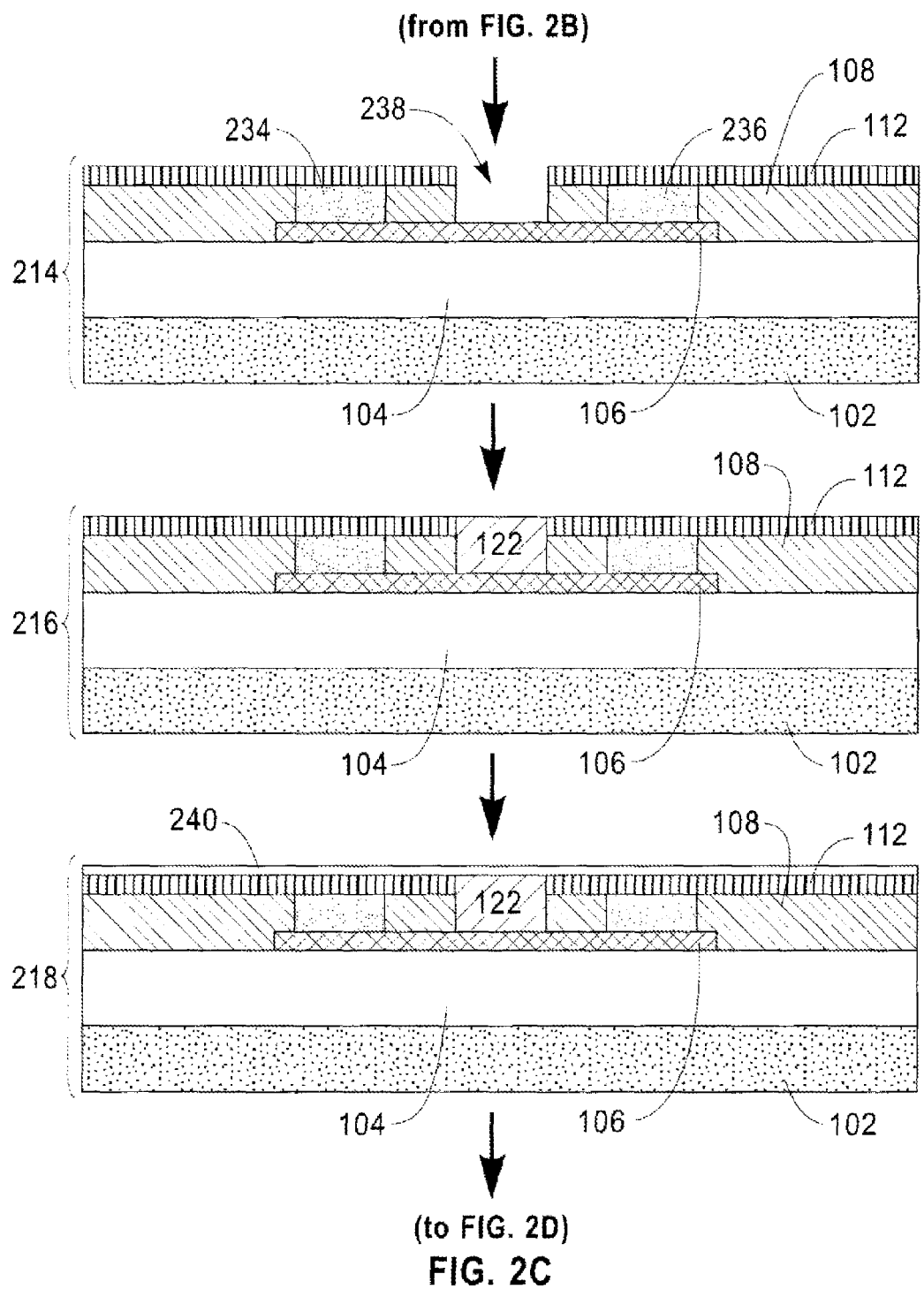
Figure 2D:
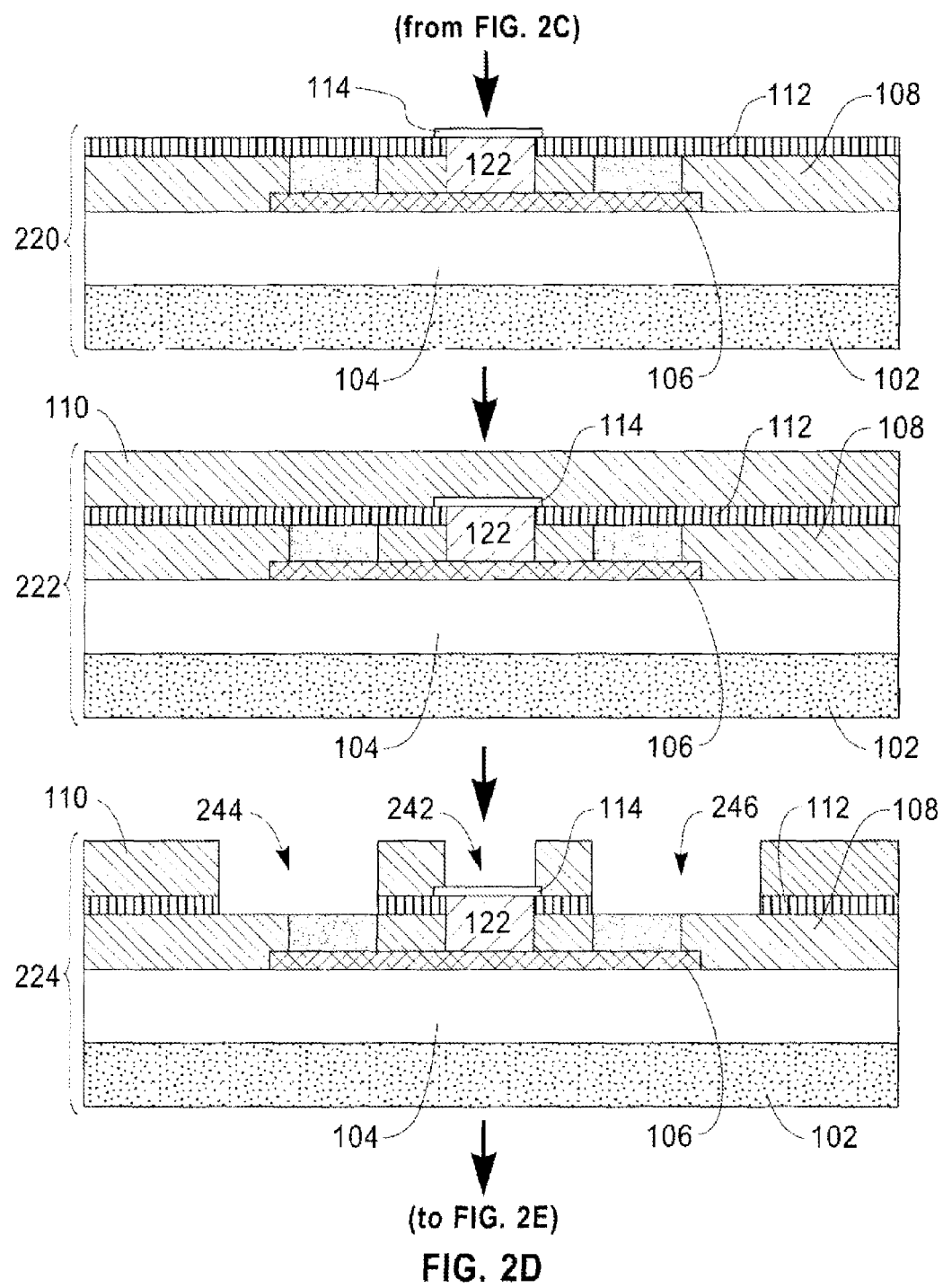
Figure 2E:
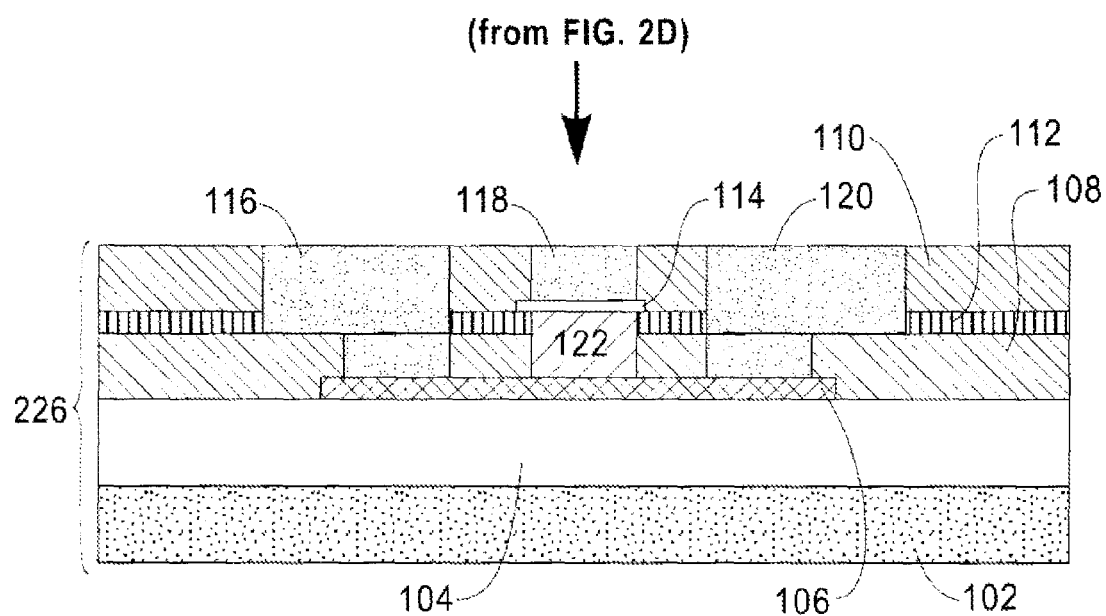

FIG. 1 is a diagram illustrating exemplary programmable via device 100. Programmable via device 100 comprises a substrate 102, a dielectric layer 104, a heater 106, oxide layers 108 and 110, capping layers 112 and 114, conductive vias 116, 118 and 120 and programmable via 122.

Specifically, programmable via device 100 comprises dielectric layer 104 over substrate 102. Substrate 102 can comprise any suitable semiconductor material, including, but not limited to, silicon (Si). Dielectric layer 104, an insulating layer, can comprise any suitable dielectric material, including, but not limited to, oxides such as silicon dioxide ($SiO_2$).

Heater 106 is present on a side of dielectric layer 104 opposite substrate 102. As shown in FIG. 1, heater 106 extends laterally over a portion of dielectric layer 104. To achieve the best efficiency of electrical-thermal transformation (i.e., from heater to programmable via), according to an exemplary embodiment heater 106 comprises a thin layer of a refractory metal having a thickness of between about five nanometers (nm) and about 100 nm with a relatively high resistivity of between about 100 ohm centimeter ($\Omega$cm) and about 10,000 $\Omega$cm, e.g., of between about 500 $\Omega$cm and about 3,000 $\Omega$cm. Suitable refractory metals include, but are not limited to, tantalum nitride (TaN) and metals having the formula $Ta_xSi_yN_z$, wherein x, y and z are each between zero and about one.

Oxide layer 108 is present over dielectric layer 104 and surrounds heater 106. As will be described in detail below, oxide layer 108 has conductive vias 116 and 120 and programmable via 122 extending therethrough. According to an exemplary embodiment, oxide layer 108 comprises $SiO_2$.

Capping layer 112 is present over a side of oxide layer 108 opposite dielectric layer 104. According to an exemplary embodiment, capping layer 112 comprises silicon nitride (SiN). SiN is a preferred capping material because of its dielectric properties and effectiveness as an etch stop during fabrication (see description below).

Programmable via 122 extends through capping layer 112 and oxide layer 108, e.g., and is in contact with heater 106. Programmable via 122 comprises a phase change material. Suitable phase change materials include, but are not limited to, one or more of ternary alloys of germanium (Ge), antimony (Sb) and tellurium (Te) (GST), such as $Ge_2Sb_2Te_5$, GeSb, $GeSb_4$ and doped derivatives thereof with substitution/addition of other elements, such as nitrogen (N) and Si.

Capping layer 114 is present over programmable via 122. Capping layer 114 extends laterally a distance beyond programmable via 122 to provide adequate coverage over programmable via 122, but not so far as to make contact with either of conductive vias 116 or 120. According to an exemplary embodiment, capping layer 114 comprises a titanium nitride—titanium alloy (TiN/Ti). TiN/Ti provides both a good diffusion barrier between conductive via 118 and the phase change material in programmable via 122 and good adhesion between conductive via 118 and the phase change material in programmable via 122.

Oxide layer 110 is present over a side of capping layer 112/capping layer 114 opposite oxide layer 108/capping layer 112, respectively. According to an exemplary embodiment, oxide layer 110 comprises $SiO_2$.

Conductive vias 116 and 120 extend through oxide layers 108 and 110 and capping layer 112, and make contact with heater 106. Conductive vias 116 and 120 can each comprise any suitable standard complementary metal-oxide-semiconductor (CMOS) process metal(s), including, but not limited to, one or more of tungsten (W) and copper (Cu). Conductive via 118 is present between conductive vias 116 and 120, and extends through oxide layer 110 making contact with capping layer 114. Like conductive vias 116 and 120, conductive via 118 can also comprise any suitable standard CMOS process metal(s), including, but not limited to, one or more of W and Cu.

Having points of contact present between conductive vias 116/120 and heater 106, and between conductive via 118 and capping layer 114, i.e., contact points 103/105 and 107, respectively, can introduce an amount of resistance within the device (referred to hereinafter as "internal contact resistance"). Internal contact resistance affects the operating voltage of the device. Namely, the larger the internal contact resistance, the larger a starting voltage to programmable function of the device, i.e., operating voltage required to switch logic states of the device.

Depending on the structure of the device/method used to form the device, the effect of internal contact resistance on operating voltage can be significant. For example, U.S. patent application Ser. No. 11/612,631, filed on Dec. 19, 2006 by Chen et al., now U.S. Pat. No. 7,652,278, entitled "Programmable Via Structure and Method of Fabricating Same," the disclosure of which is incorporated by reference herein, describes a programmable via structure formed using a lift-off process. The lift-off process can permit oxidation of/between contact surfaces to occur that can increase the internal contact resistance of the device raising the operating voltage, e.g., to ten volts or greater.

As will be described in detail below, programmable via device 100 is fabricated so as to have little, if any, internal contact resistance, i.e., less than about $10^{-4}$ ohm square centimeter ($\Omega cm^2$). As a result, programmable via device 100 has an operating voltage of less than about five volts, e.g., between about two volts and about three volts.

FIGS. 2A-E are diagrams illustrating exemplary methodology 200 for fabricating a programmable via device, such as programmable via device 100 described in conjunction with the description of FIG. 1, above. The fabrication techniques described herein are CMOS compatible and thus readily scalable to meet various technology node feature size requirements.

In step 202, substrate 102 is provided. Dielectric layer 104 is formed on substrate 102. According to an exemplary embodiment, substrate 102 comprises Si and dielectric layer 104 comprises an oxide layer (as described above) grown on substrate 102 using a thermal oxidation process. Alternatively, dielectric layer 104 can comprise an oxide layer deposited on substrate 102 using a conventional deposition process, such as chemical vapor deposition (CVD), plasma enhanced chemical vapor deposition (PECVD), atomic layer deposition (ALD) and chemical solution deposition and evaporation. With either technique, dielectric layer 104 is formed having a thickness of between about five nm and about 2,000 nm, e.g., between about 100 nm and about 500 nm.

Heater material layer 230 is then deposited on dielectric layer 104. According to an exemplary embodiment, heater material layer 230 comprises a refractory metal (as described above) and is deposited on dielectric layer 104 using a CVD technique, such as low pressure chemical vapor deposition (LPCVD).

In step 204, heater material layer 230 is patterned to form heater 106. According to an exemplary embodiment, photolithography is used to pattern heater material layer 230, wherein a photoresist is deposited on heater material layer 230, masked and patterned with the footprint of heater 106. A conventional dry etch, such as reactive ion etching (RIE) is then used to form heater 106.

In step 206, oxide layer 108 is deposited over dielectric layer 104 so as to surround heater 106. According to an exemplary embodiment, oxide layer 108 is deposited using CVD. As shown in step 206, oxide layer 108 takes on the topography of heater 106 on dielectric layer 104.

In step 208, vias 234 and 236 are formed through oxide layer 108. According to an exemplary embodiment, vias 234 and 236 are formed using photolithography, wherein a photoresist is deposited on oxide layer 108, masked and patterned with the vias. A deep RIE is then be used to form vias 234 and 236 through oxide layer 108, with heater 106 acting as an etch stop.

In step 210, each of vias 234 and 236, formed in step 208, above, are filled with a metal such as one or more of W and Cu (as described above) to form conductive vias. The metal will establish a direct contact point between each of the vias and the heater. This process insures that little, if any, internal contact resistance will be generated by the device structure. Chemical mechanical planarization (CMP) is then used to planarize vias 234/236 and oxide layer 108.

In step 212, capping layer 112 is deposited over a side of oxide layer 108 opposite dielectric layer 104. According to an exemplary embodiment, capping layer 112 is deposited on oxide layer 108 using CVD.

In step 214, via 238 is formed through oxide layer 108 and capping layer 112 between vias 234 and 236. According to an exemplary embodiment, via 238 is formed using photolithography, wherein a photoresist is deposited on capping layer 112, masked and patterned with the via. A deep RIE is then used to form via 238 through oxide layer 108 and capping layer 112, with heater 106 acting as an etch stop.

In step 216, via 238 formed in step 214, above, is filled with a phase change material (as described above). CMP is then used to planarize the phase change material with capping layer 112 as an etch stop. As a result, programmable via 122 is formed.

In step 218, capping layer 240 is deposited over a side of capping layer 112 opposite oxide layer 108. According to an exemplary embodiment, capping layer 240 is deposited over capping layer 112 using CVD. In step 220, capping layer 240 is patterned to form capping layer 114, covering and extending laterally a distance beyond programmable via 122, so as to provide adequate coverage over programmable via 122 (as described above). According to an exemplary embodiment, capping layer 114 is formed using photolithography, wherein a photoresist is deposited on capping layer 240, masked and patterned with the footprint and location of capping layer 114. A RIE is then used to form capping layer 114, with capping layer 112 as an etch stop.

In step 222, oxide layer 110 is deposited over a side of capping layer 112 opposite oxide layer 108, and covering capping layer 114. According to an exemplary embodiment, oxide layer 110 is deposited over capping layer 112 using CVD.

In step 224, via 242 is formed through oxide layer 110, and vias 244 and 246 are formed through oxide layer 110 and capping layer 112. According to an exemplary embodiment, a two-step etching process is used to form vias 242, 244 and 246. Namely, a photoresist is deposited on oxide layer 110, masked and patterned with each of the vias. An oxide-selective RIE is then used to etch vias 242 and 244/246 through oxide layer 110, with capping layers 114 and 112, respectively, as etch stops. A second, nitride-selective RIE is then used to etch vias 244/246 through capping layer 112.

In step 226, each of vias 244 and 246, formed in step 224, above, are filled with a metal such as one or more of W and Cu (as described above) to form conductive vias. Since vias 244 and 246 in conjunction with vias 234 and 236 (formed in steps 208 and 210), respectively, will comprise conductive vias of the device, it is preferable that the same metal be used to fill vias 234/244 and vias 236/246. Via 242, formed in step 224, above, is also filled with a metal such as one or more of W and Cu (as described above), forming conductive via 118.

CMP is then used to planarize the metal with oxide layer 110 as an etch stop. As a result, via 244 extends via 234 to form conductive via 116 and via 246 extends via 236 to from conductive via 120.

Programmable via device 100 is thus formed. Advantageously, the device is planar which permits easy integration into logic circuits.

Figure 3A:
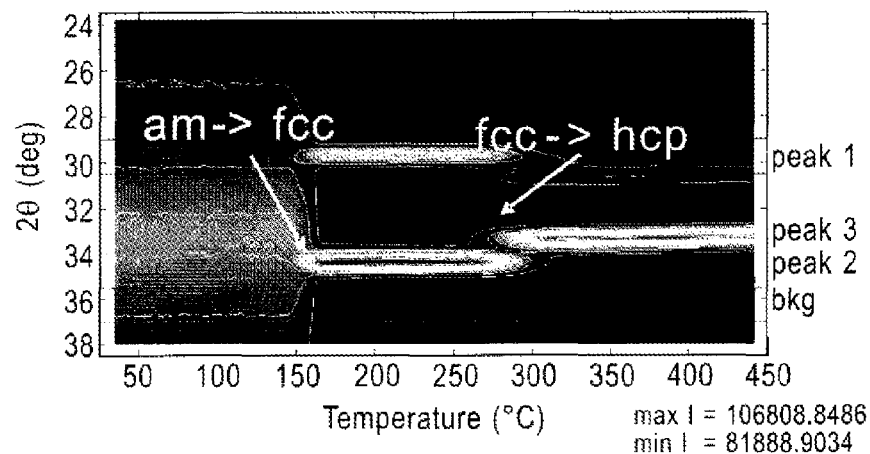
FIGS. 3A-C are graphs illustrating operation of a phase change material according to an embodiment of the present invention.
Figure 3B:
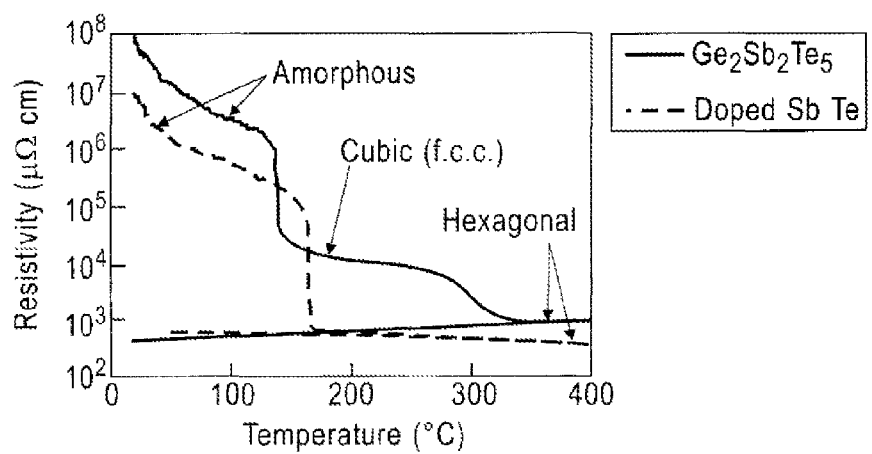
Figure 3C:
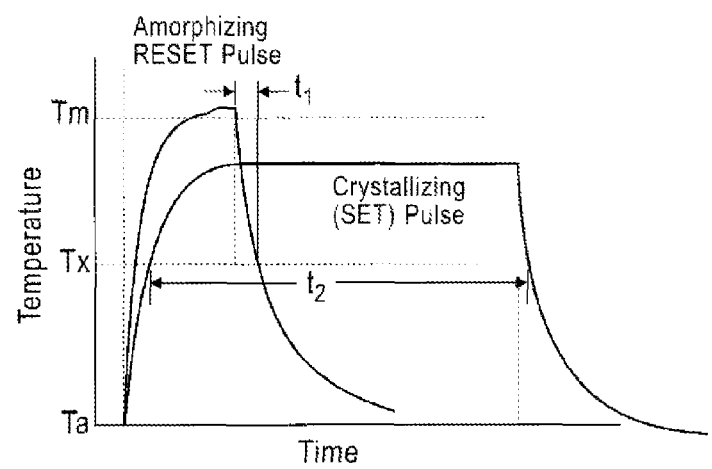

FIGS. 3A-C are graphs illustrating operation of the phase change material used in the programmable via of programmable via device 100, described, for example, in conjunction with the description of FIG. 1, above. FIG. 3A is a graph illustrating two theta (deg) (x-ray diffraction) evolution of the crystal structure of $Ge_2Sb_2Te_5$ from amorphous (no line), to face-centered cubic (fcc) to hexagonal close-packed (hcp) on heating (with temperature measured in degrees Celsius (° C.)). In FIG. 3A, at room temperature (e.g., about 27° C.), and up to moderately elevated temperatures (e.g., up to between about 400° C. and about 500° C.), the material is stable in two phases, a crystalline phase which is a moderately good conductor of electricity (i.e., about 200 microohms centimeter (μΩcm), and an amorphous phase which is insulating. FIG. 3B is a graph illustrating resistivity (measured in μΩcm) versus temperature (measured in ° C.) for two phase change material samples, i.e., $Ge_2Sb_2Te_5$ and doped SbTe, showing different resistivities of different phases. The phases are interconverted by thermal cycling.

FIG. 3C is a graph illustrating thermal cycling for SET and RESET processes of the phase change material, as a function of temperature and time. Namely, the thermal cycling comprises a "RESET" (or OFF) pulse and a "SET" (or ON) pulse.

The "RESET" (or OFF) pulse involves a conversion from crystalline to amorphous form. In this step, the temperature is raised above melting, followed by a rapid quench in a time $t_1$ as a result of which a disordered arrangement of atoms in the melt is retained. The "SET" (or ON) pulse involves an anneal at a lower temperature, for a longer time $t_2$, which enables the amorphous form to crystallize.

Figure 4:
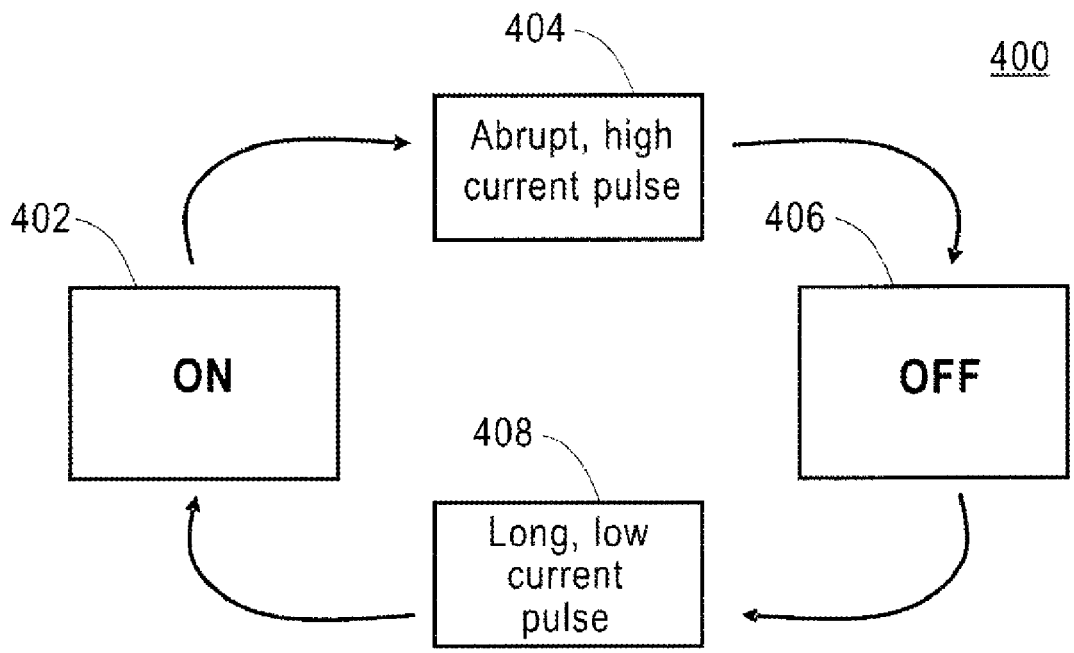
FIG. 4 is a diagram illustrating an exemplary methodology for performing a logic function with the programmable via device of FIG. 1 according to an embodiment of the present invention.

FIG. 4 is a diagram illustrating exemplary methodology 400 for performing a logic function with programmable via device 100, described, for example, in conjunction with the description of FIG. 1, above. The phase change material used in programmable via 122 can be switched between resistive (OFF-amorphous) and conductive (ON-crystalline) states by passing a current pulse through heater 106 which is in contact with programmable via 122.

Specifically, in step 402 programmable via device 100 is in an ON state. In step 404, an abrupt, e.g., a 10 nanosecond (ns) ramp up, a 50 ns plateau and a two ns ramp down, high-current, e.g., greater than one milliamp (mA), pulse is passed through heater 106 to melt and quench/amorphize a thin region of the phase change material adjacent to the heater. OFF switching pulses are described in detail in conjunction with the description of FIG. 5, below. Another exemplary OFF switching pulse can comprise a 19 ns ramp up, a 20 ns plateau and a two ns ramp down, at a current of greater than one mA.

In step 406, programmable via device 100 is now in a resistive (OFF-amorphous) state, and can remain in the OFF state until switched again. In step 408, an ON switching operation is accomplished by applying a relatively low current, e.g., less than or equal to about 0.5 mA, longer pulse, e.g., a 200 ns ramp up, a 1,000 ns plateau and a 200 ns ramp down, through heater 106 to anneal the amorphous phase change material to a crystalline state. ON switching pulses are described in detail in conjunction with the description of FIG. 6, below. Programmable via device 100 is now back in the conductive (ON-crystalline) state. The state of programmable via device 100, resistive or conductive, can be read through conductive vias 118 and 120.

Figure 5:
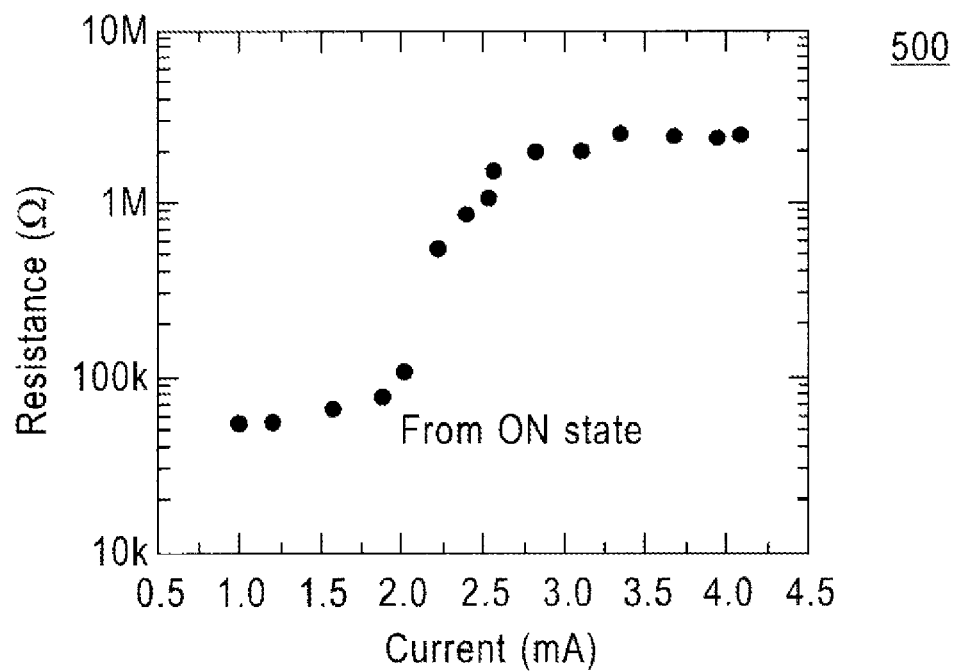
FIG. 5 is a graph illustrating resistance-current (R-I) characteristics for switching the programmable via device of FIG. 1 to an OFF state according to an embodiment of the present invention.

FIG. 5 is a graph 500 illustrating resistance-current (R-I) characteristics for switching programmable via device 100, described, for example, in conjunction with the description of FIG. 1, above, to an OFF state. According to an exemplary embodiment, 50 ns pulses with gradually increased power were applied to heater 106 from the ON state. Specifically, a ten ns ramp up, a 50 ns plateau and a two ns ramp down were employed. After each pulse, programmable via device 100 was switched back to the ON state. When the pulse current reached about two milliamps (mA), the programmable via resistance started to increase and finally reached the OFF state.

Figure 6:
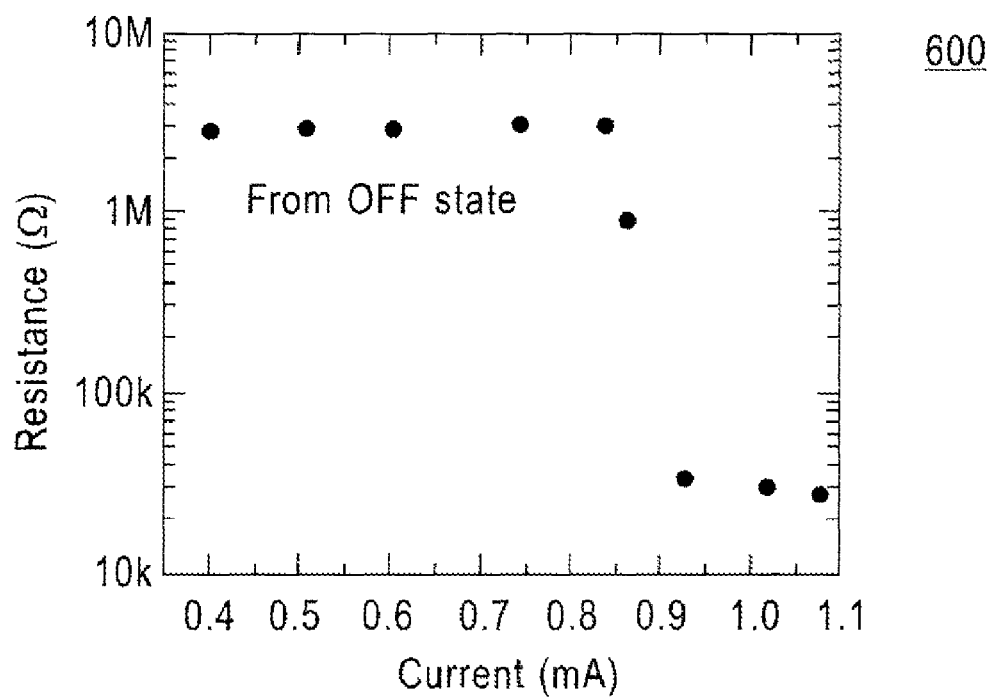
FIG. 6 is a graph illustrating R-I characteristics for switching the programmable via device of FIG. 1 to an ON state according to an embodiment of the present invention.

FIG. 6 is a graph 600 illustrating R-I characteristics for switching programmable via device 100, described, for example, in conjunction with the description of FIG. 1, above, to an ON state. Starting from an OFF state, one microsecond (μs) pulses with gradually increased power were applied to heater 106, finally implementing switching of the device to the ON state. Specifically, a 200 ns ramp up, a 1,000 ns plateau and then a 200 ns ramp down were employed.

Figure 7:
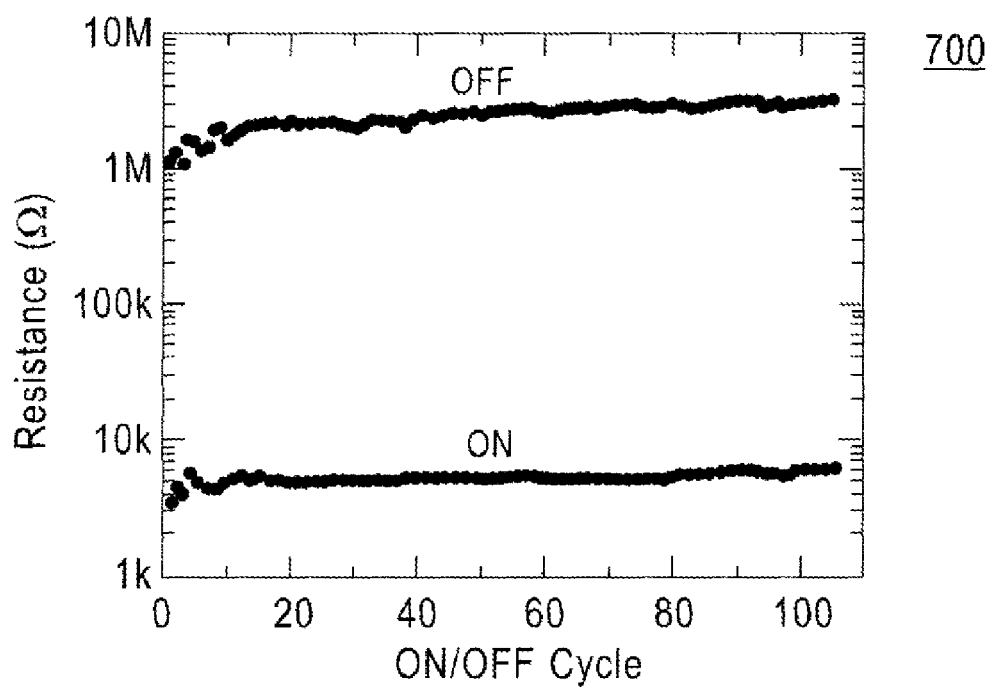
FIG. 7 is a graph illustrating cycling data from an endurance test of the programmable via device of FIG. 1 performed at room temperature according to an embodiment of the present invention.

FIG. 7 is a graph 700 illustrating cycling data from an endurance test performed on programmable via device 100, described, for example, in conjunction with the description of FIG. 1, above, at room temperature. The endurance test results show a stable sense margin without obvious degradation within the ON/OFF cycles.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of performing a logic function, the method comprising the steps of:
    providing a programmable via device comprising:
        a substrate;
        a dielectric layer on the substrate;
        a heater on at least a portion of a side of the dielectric layer opposite the substrate;
        a first oxide layer over the side of the dielectric layer opposite the substrate and surrounding at least a portion of the heater;
        a first capping layer over a side of the first oxide layer opposite the dielectric layer;
        at least one programmable via extending through the first capping layer and the first oxide layer and in contact with the heater, the programmable via comprising at least one phase change material;
        a second capping layer over the programmable via;
        a second oxide layer over a side of the first capping layer opposite the first oxide layer;
        a pair of first conductive vias, each extending through the first and second oxide layers and the first capping layer, and in contact with the heater; and
        a second conductive via, located between the pair of first conductive vias, extending through the second oxide layer and in contact with the second capping layer; and
    passing one or more of:
        an OFF switching pulse through the heater, when the programmable via is in a conductive state, the OFF switching pulse being configured to amorphize at least a portion of the phase change material in the programmable via to switch the programmable via to a resistive state, and
        an ON switching pulse through the heater, when the programmable via is in a resistive state, the ON switching pulse being configured to anneal at least a portion of the phase change material in the programmable via to switch the programmable via to a conductive state.

2. The method of claim 1, further comprising the step of:
    reading the state of the device through one of the first conductive vias in combination with the second conductive via.

3. The method of claim 1, wherein the OFF switching pulse comprises a ten nanosecond ramp up, a 50 nanosecond plateau and a two nanosecond ramp down, with a current of greater than about one milliamp.

4. The method of claim 1, wherein the ON switching pulse comprises a 200 nanosecond ramp up, a 1,000 nanosecond plateau and a 200 nanosecond ramp down, with a current of less than or equal to about 0.5 milliamps.

* * * * *